(12) United States Patent
Ni (10) Patent No.: US 8,766,400 B2
(45) Date of Patent: Jul. 1, 2014

(54) ELECTRONIC DEVICE CONTAINING PASSIVE COMPONENTS AND FABRICATION METHOD THEREOF

(76) Inventor: Ching-Yu Ni, Hsinchu (TW)

( * ) Notice: Subject to any disclaimer, the term of this patent is extended or adjusted under 35 U.S.C. 154(b) by 246 days.

(21) Appl. No.: 12/843,869

(22) Filed: Jul. 26, 2010

(65) Prior Publication Data

US 2011/0042783 A1 Feb. 24, 2011

Related U.S. Application Data

(60) Provisional application No. 61/235,649, filed on Aug. 20, 2009.

(51) Int. Cl.
*H01L 23/52* (2006.01)

(52) U.S. Cl.
USPC ............... 257/531; 257/532; 257/E21.022; 257/E21.008; 257/E29.342; 257/E29.325; 438/396; 438/381

(58) Field of Classification Search
USPC ............... 257/531, 532, E21.022, E21.008, 257/E29.342, E29.325; 438/396, 381
See application file for complete search history.

(56) References Cited

U.S. PATENT DOCUMENTS

| | | |
|---|---|---|
| 2005/0258466 A1 | 11/2005 | Kwak et al. |
| 2006/0087029 A1 | 4/2006 | Imanaka et al. |
| 2008/0174976 A1* | 7/2008 | Satoh et al. ............... 361/762 |
| 2008/0318356 A1* | 12/2008 | Onozuka et al. ............ 438/51 |
| 2009/0200555 A1 | 8/2009 | Ishihama |

FOREIGN PATENT DOCUMENTS

| | | |
|---|---|---|
| TW | 552686 | 9/2003 |
| TW | 200804172 | 1/2008 |

OTHER PUBLICATIONS

Bhattacharya, et al., "Integral Passives for Next Generation of Electronic Packaging; Application of Epoxy/Ceramic Nanocomposites as Integral Capacitors", Microelectronics Journal 32 (2001), pp. 11-19.

* cited by examiner

*Primary Examiner* — Elias M Ullah
(74) *Attorney, Agent, or Firm* — Liu & Liu (57) ABSTRACT

An electronic device and fabrication method thereof are provided. The electronic device contains a glass substrate, a patterned semiconductor substrate, having at least one opening, disposed on the glass substrate and at least one passive component having a first conductive layer and a second conductive layer, wherein the first conductive layer is disposed between the patterned semiconductor substrate and the glass substrate.

22 Claims, 8 Drawing Sheets

ELECTRONIC DEVICE CONTAINING PASSIVE COMPONENTS AND FABRICATION METHOD THEREOF

CROSS REFERENCE TO RELATED APPLICATIONS

This application claims the benefit of U.S. Provisional application No. 61/235,649, filed on Aug. 20, 2009, the entirety of which is incorporated by reference herein.

BACKGROUND OF THE INVENTION

1. Field of the Invention

The present invention relates to an electronic device, and in particular relates to a passive component of a capacitor and/or an inductor and a fabrication method thereof.

2. Description of the Related Art

Generally, some passive components, for example resistors, capacitors or inductors, etc. are disposed around active components of chips for electric energy storage or electric energy release from circuits to adjust the stability of current. The capacitors consist of two electrodes and a dielectric layer between the two electrodes. The inductors are usually spiral inductors.

The conventional capacitors and inductors can be fabricated on a print circuit board (PCB) for a chip package. The dielectric layer of the conventional capacitor is usually made from polymer, such that a high quality factor (Q) of the capacitors can be achieved. However, the capacitance density of the conventional capacitor is reduced thereby. Although a polymer of high dielectric constant can be used for the dielectric layer of capacitor to enhance the capacitance density thereof, the polymer of high dielectric constant is expensive and the fabrication processes of using the polymer of high dielectric constant is not easy.

Thus, an electronic device with a new structure, designed to achieve a high capacitance density and/or a high quality factor (Q) is desired.

BRIEF SUMMARY OF THE INVENTION

According to an illustrative embodiment, an electronic device is provided. The electronic device comprises a glass substrate; a patterned semiconductor substrate, having at lest one opening, disposed on the glass substrate; and at least one passive component, having a first conductive layer and a second conductive layer, wherein the first conductive layer is disposed between the patterned semiconductor substrate and the glass substrate.

According to another illustrative embodiment, a method for fabricating an electronic device is provided. The method comprises providing a semiconductor substrate, having a passive component area. A dielectric layer is formed on the semiconductor substrate. A plurality of lower-layered openings is formed in the dielectric layer. A first conductive layer is formed on the dielectric layer and in the lower-layered openings. A glass substrate is provided for bonding the semiconductor substrate with the glass substrate, wherein the dielectric layer and the first conductive layer are disposed between the glass substrate and the semiconductor substrate.

According to another illustrative embodiment, the method for fabricating an electronic device further comprises forming a plurality of upper-layered openings at the passive component area of the semiconductor substrate to expose the dielectric layer and/or the first conductive layer in the lower-layered openings. A first protective layer is formed on the semiconductor substrate and on the side walls of the upper-layered openings. A second conductive layer is formed on the first protective layer and in the upper-layered openings for contact with the dielectric layer and/or the first conductive layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

An embodiment of the invention provides an electronic device using a semiconductor substrate and a glass substrate to fabricate a passive component and a fabrication method thereof. The embodiment can be used to form an inductor or a metal-insulator-metal (MIM) capacitor individually or to form an inductor-capacitor integrated passive component (L-C IPC) containing the MIM capacitor. In the following description, the embodiments of electronic devices of the invention and fabrication methods thereof are illustrated by embodiments of showing a capacitor area and an inductor area together for conveniently illustrating the invention, but it is not limited to fabricating the capacitor and the inductor at the same time. According to the structures of the embodiments of the invention, a high capacitance density and a high quality factor (Q) are achieved. The capacitors or the inductors of the embodiments can be fabricated from a silicon wafer and a glass carrier, thus the fabrication cost thereof is reduced.

Figure 1:
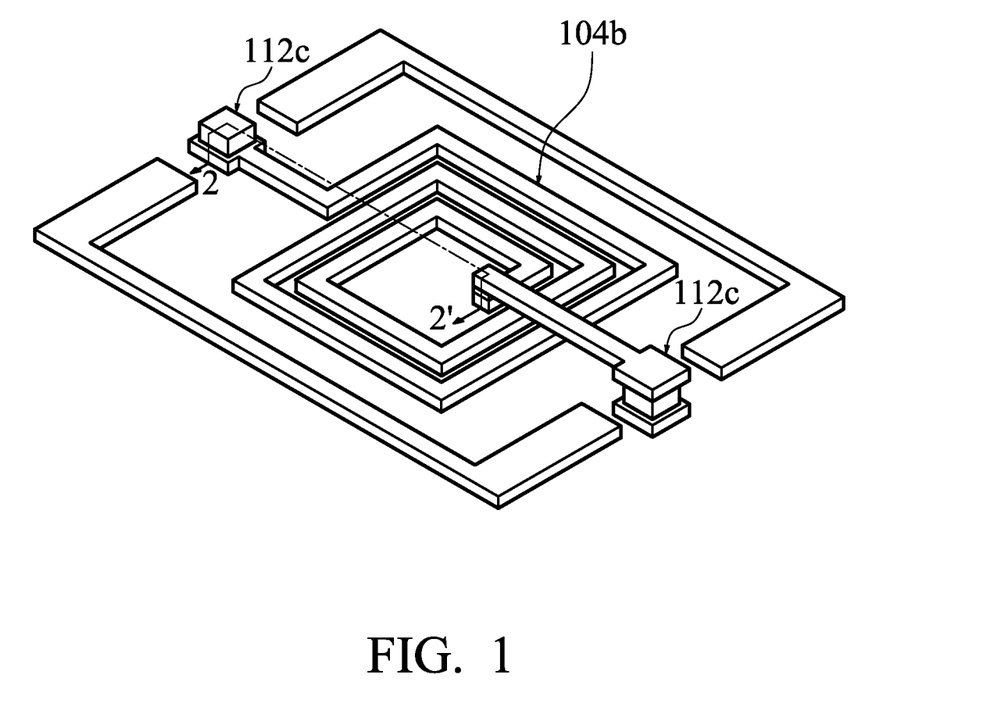
FIG. 1 shows an illustrative plane view of an inductor according to an embodiment of the invention.
Figure 2:
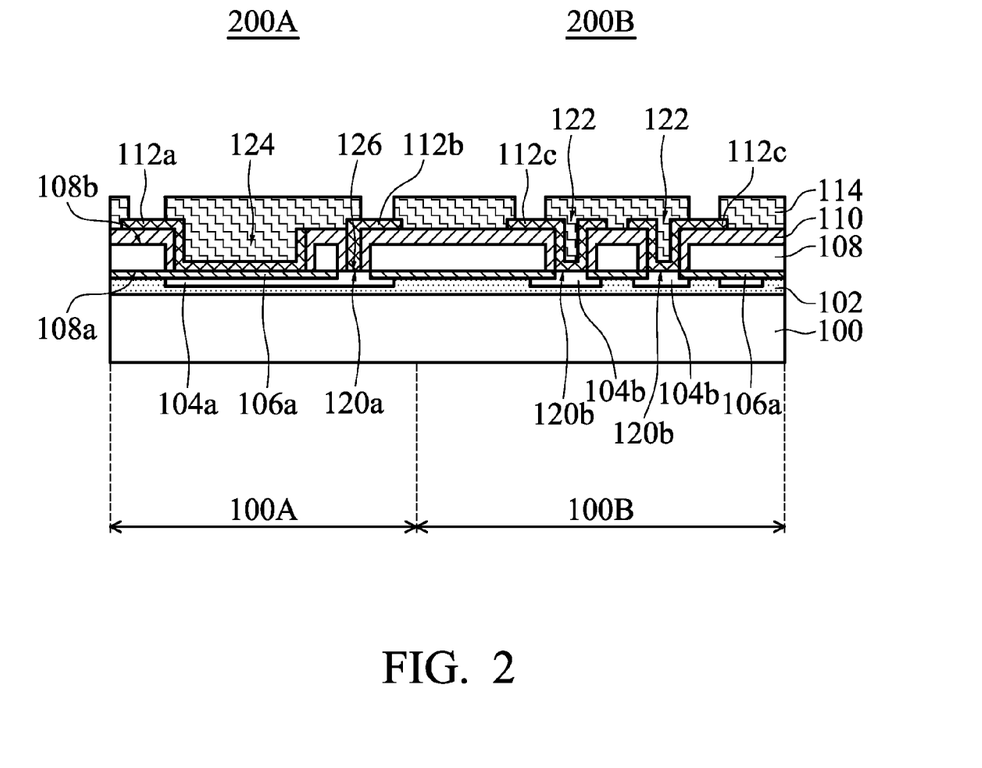
FIG. 2 shows an illustrative cross section of a capacitor-inductor integrated passive component according to an embodiment of the invention.

Referring to FIG. 2, a cross section of a passive component according to an embodiment of the invention is shown. In an embodiment, a plane view of an inductor of the invention is shown in FIG. 1, which is a spiral inductor. A spiral shape of the inductor can be a square-typed spiral shape as shown in FIG. 1 or a circle-type spiral shape. A cross section of an inductor along a cross section line 2-2' of FIG. 1 is shown as an inductor area 100B of FIG. 2. Nevertheless, the inductor area 100B of FIG. 2 only shows a first conductive layer 104b and a second conductive layer 112c of the inductor.

As shown in FIG. 2, an electronic device of an embodiment includes a glass substrate 100 and a patterned semiconductor substrate 108, for example a silicon substrate. The patterned semiconductor substrate 108 has at least one upper-layered opening, for example a great-sized opening 124 a smaller-sized opening 122 disposed over the glass substrate. The electronic device includes at least one passive component, such as a capacitor 200A and/or an inductor 200B, containing first conductive layers 104a and 104b and second conductive layers 112a and 112c, wherein the first conductive layers 104a and 104b are disposed between the semiconductor substrate 108 and the glass substrate 100. In addition, the second conductive layers 112a and 112c can be disposed in the upper-layered openings 124 and 122 to cooperate with a structure design of the passive component.

Referring to FIG. 2 again, the passive component at the inductor area 100B contains an inductor 200B, in which the first conductive layer 104b is electrically connected to the second conductive layer 112c. In addition, the passive component at the capacitor area 100A contains a capacitor 200A. The capacitor 200A includes a dielectric layer 106a disposed between the semiconductor substrate 108 and the glass substrate 100, and the dielectric layer 106a is combined with the first conductive layer 104a and the second conductive layer 112a to form a sandwich structure.

In other words, in an embodiment of a capacitor-inductor integrated structure, the passive component simultaneously includes the capacitor 200A and the inductor 200B. The semiconductor substrate 108 contains a first opening 124 corresponding to the capacitor 200A and a second opening 122 corresponding to the inductor 200B, wherein the second conductive layers 112a and 112c are disposed in the first opening 124 and the second opening 122, respectively. Meanwhile, the second conductive layer 112c at the second opening 122 corresponding to the inductor is electrically connected to the first conductive layer 104b. In addition, the capacitor contains a dielectric layer 106a disposed between the semiconductor substrate 108 and the glass substrate 100. The second conductive layer 112a at the first opening 124 corresponding to the capacitor is combined with the first conductive layer 104a and the dielectric layer 106a to form a sandwich structure.

In an embodiment, the second opening 122 is smaller than the first opening 124. The second conductive layers 112a and 112c are conformally formed in the first opening 124 corresponding to the capacitor and in the second opening 122 corresponding to the inductor, respectively. Because the dielectric layer 106a is a planarization layer, the first conductive layer 104a of the capacitor and the first conductive layer 104b of the inductor are co-planar. Meanwhile, the second conductive layer 112a of the capacitor and the second conductive layer 112c of the inductor are also co-planar. In addition, the bonding of the semiconductor and the glass substrate can be achieved by an adhesive layer 102, for example a layer made of epoxy resin.

Moreover, for isolating the second conductive layers 112a and 112c from the semiconductor substrate 108, in an embodiment, further, a first protective layer 110 is conformally formed to cover the semiconductor substrate 108. In addition, after the second conductive layers 112a and 112c are formed, a planarized second protective layer 114 can be formed to cover the second conductive layers 112a and 112c and the first protective layer 110. The materials of the first and the second protective layers may be a photosensitive insulating material, for example a photo-resist.

Figure 3:
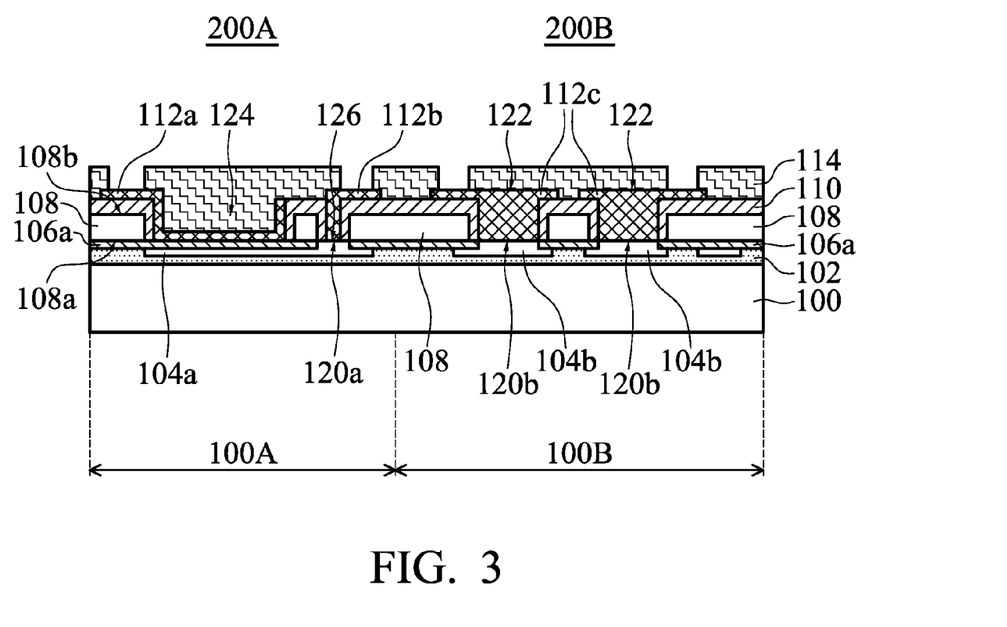
FIG. 3 shows an illustrative cross section of a capacitor-inductor integrated passive component according to another embodiment of the invention.

Referring to FIG. 3, a cross section of an electronic device according to another embodiment of the invention is shown. The difference between the electronic devices of FIG. 3 and FIG. 2 is that the second conductive layer 112c is formed to fill the second opening 122 corresponding to the inductor in FIG. 3.

Moreover, at the capacitor area, the first conductive layer 104a is used for a lower electrode layer of the capacitor, thus an upper-layered opening 126 is further formed over the first conductive layer 104a and a conductive layer 112b is formed in the upper-layered opening 126 for connecting the lower electrode layer of the capacitor to an external circuit.

In a detailed description of an embodiment, the glass substrate 100 has a capacitor area 100A and/or an inductor area 100B. The patterned semiconductor substrate 108 is disposed over the glass substrate 100. The patterned semiconductor substrate 108 has a lower surface 108a and an upper surface 108b. A dielectric layer 106a is disposed on the lower surface 108a. The dielectric layer 106a may be formed from silicon oxide, silicon nitride, silicon oxynitride or combinations thereof, which can be formed by a thermal oxidation process or a chemical vapor deposition process. The thickness of the dielectric layer 106a is about 500 Å to about 1000 Å.

A plurality of openings 120a and/or 120b is formed in the dielectric layer 106a and the first conductive layers 104a and 104b are formed on the dielectric layer 106a and in the openings 120a and/or 120b of the dielectric layer 106a. Thus, the first conductive layers 104a and 104b are disposed between the semiconductor substrate 108 and the glass substrate 100. In addition, an adhesive layer 102 may be used for bonding the semiconductor substrate 108 and the glass substrate 100. The material of the adhesive layer 102 may be epoxy resin or other adhesive materials.

At least one opening, such as the opening 122, is formed on the upper surface 108b of the semiconductor substrate 108 at the inductor area 100B. The opening 122 is formed by passing through the semiconductor substrate 108 to expose the first conductive layer 104b in the openings 120b. In addition, an opening 124 can be formed on the upper surface 108b of the semiconductor substrate 108 at the capacitor area 100A to expose the dielectric layer 106a. In an embodiment, further, an opening 126 can be formed on the upper surface 108b of the semiconductor substrate 108 to expose the first conductive layer 104a in the opening 120a. The second conductive layers 112a, 112b and 112c can be isolated from the semiconductor substrate 108 by a first protective layer 110. For example, the second surface 108b of the semiconductor substrate 108 and the side walls of the openings 122, 124 and 126 are covered with the first protective layer 110. Then, the second conductive layers 112a, 112b and 112c are formed on the first protective layer 110 and on the side walls and the bottom surfaces of the openings 122, 124 and 126. Next, a second protective layer 114 is formed on the second conductive layers 112a, 112b and 112c and on the first protective layer 110, and portions of the second conductive layers 112a, 112b and 112c are exposed. The first conductive layer 104a at the capacitor area 100A, the dielectric layer 106a and the second conductive layer 112a are combined to form a sandwich structure of the capacitor. The first conductive layer 104b of the inductor at the inductor area 100B is formed as an inductor winding area of FIG. 1. Two end contacts of the first conductive layer 104b are electrically connected to an external circuit by the second conductive layer 112c. In an embodiment, the capacitor and the inductor can be integrated to form an inductor-capacitor integrated passive component by a series of connections or a parallel connection. Moreover, the first conductive layers of the capacitor and the inductor are disposed on the same plane, and the second conductive layers of the capacitor and the inductor are also disposed on the same plane, such that a requirement for a flat electronic device is satisfied.

The materials of the first conductive layer 104 and the second conductive layer 112 may be a low resistance metal layer, for example gold, silver and copper etc., which can be formed by an electroplating process or a deposition process and then patterned by a photolithography and etching process to form the patterns of the first conductive layer 104 and the second conductive layer 112.

The materials of the first protective layer 110 and the second protective layer 114 may be a photosensitive insulating material, for example photosensitive organic polymer materials. The compositions of the photosensitive organic polymer materials may include, but is not limited to, a polyimide (PI), butylcyclobutene (BCB), parylene, polynaphthalenes, fluorocarbons, and accrylates material etc. The photosensitive organic polymer materials can be formed by a coating process, such as a spin coating, a spray coating, or a curtain coating process, or other suitable deposition methods. Then, the photosensitive organic polymer materials can be patterned by an exposure and a development process to form the patterns of the first protective layer 110 and the second protective layer 114.

Figure 4A:
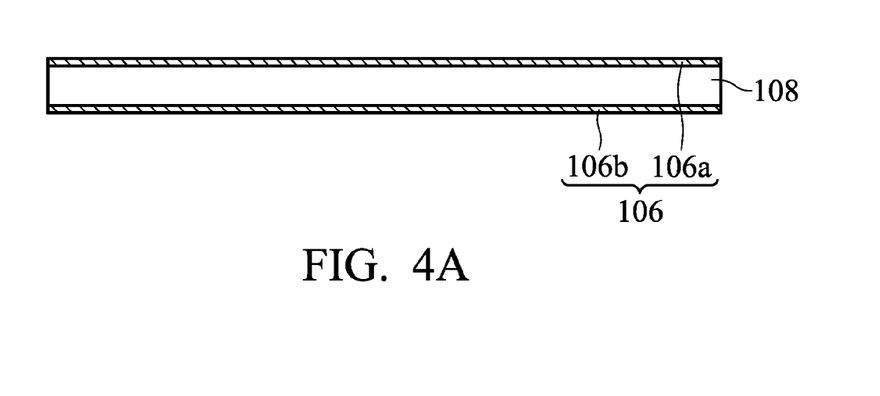
FIGS. 4A-4K illustrates a cross section showing the steps for fabricating a capacitor-inductor integrated passive component according to an embodiment of the invention.
Figure 4B:
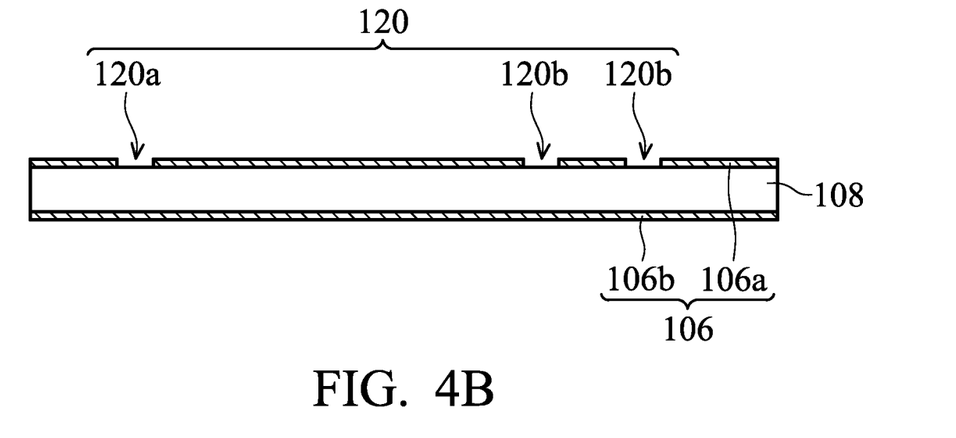

Next, FIGS. 4A-4K show cross sections of the steps for fabricating an electronic device having a passive component according to an embodiment of the invention. Referring to FIG. 4A, firstly, a semiconductor substrate 108, for example a silicon wafer is provided. Then, a dielectric layer 106 is formed on the surfaces of the semiconductor substrate 108. In an embodiment, the dielectric layer 106 may be planarized silicon oxide layers 106a and 106b formed by a thermal oxidization process. In an embodiment, the dielectric layer 106 may be formed from silicon nitride or silicon oxynitride by a chemical vapor deposition process. Next, as shown in FIG. 4B, at least one lower-layered opening 120, for example the opening 120a at the capacitor area and/or the opening 120b at the inductor area, is formed in the dielectric layer 106a by a photolithography and etching process.

Figure 4C:
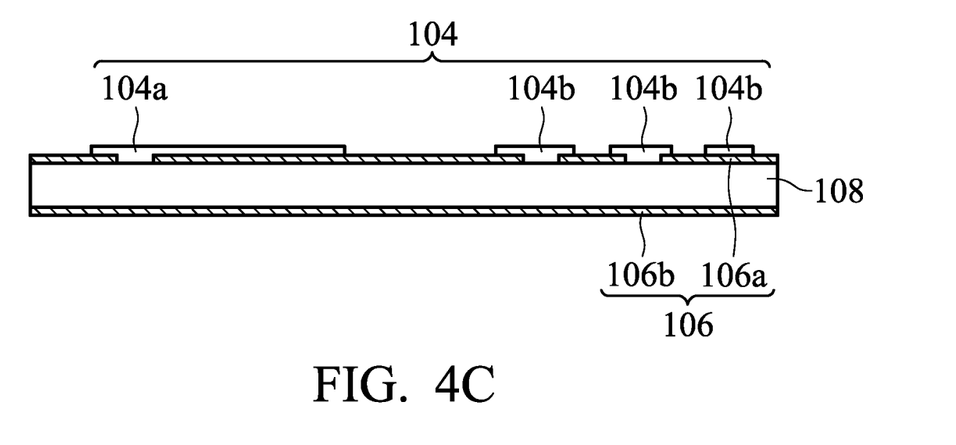

Then, referring to FIG. 4C, the first conductive layer 104 is formed on the dielectric layer 106a and in the lower-layered openings 120. For example, a metal layer (not shown) is formed on the dielectric layer 106a and in the openings 120 by an electroplating process or a deposition process. The metal layer may be formed from copper and has a thickness of about 10 µm. In an embodiment, a seed layer for copper electroplating is formed by a deposition process and then a copper layer is coated on the seed layer by an electroplating process to form the metal layer. Then, the metal layer is patterned by a photolithography and etching process to form a patterned first conductive layer 104a in the opening 120a of the capacitor area and on the dielectric layer 106a, and to form a patterned first conductive layer 104b in the openings 120b of the inductor area.

Figure 4D:
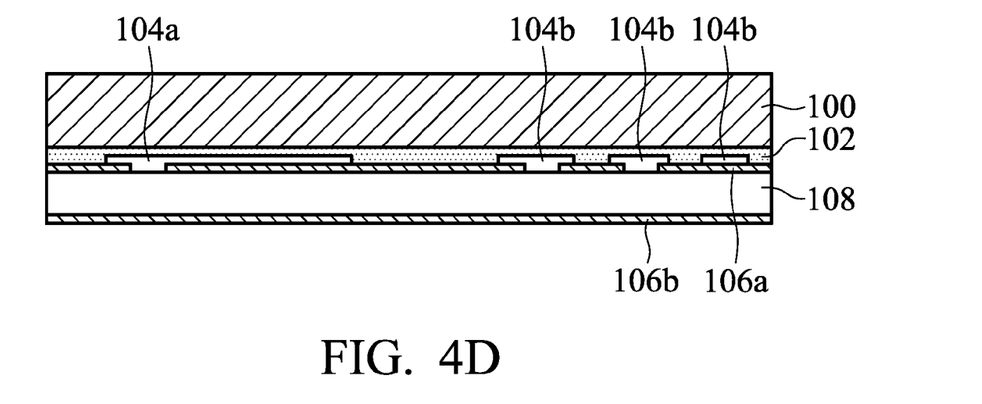
Figure 4E:
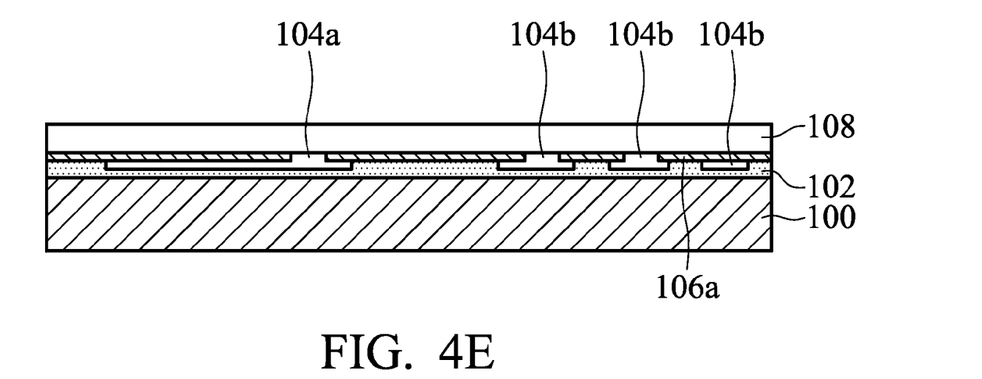

Referring to FIG. 4D, a glass substrate 100, having a thickness of about 400 µm is provided. Then, in an embodiment, an adhesive layer 102 may be used for bonding the semiconductor substrate 108 with the glass substrate 100. Thus, the first conductive layer 104 is disposed between the glass substrate 100 and the semiconductor substrate 108. Next, referring to FIG. 4E, the glass substrate 100 can be reversed and used as a carrier for performing a thinning process to the semiconductor substrate 108. The thinning process may be a polishing process or an etching process and the thickness of the semiconductor substrate 108 can be reduced to about several tens of micrometers. Meanwhile, the dielectric layer 106b on the backside of the semiconductor substrate 108 is removed together.

Figure 4F:
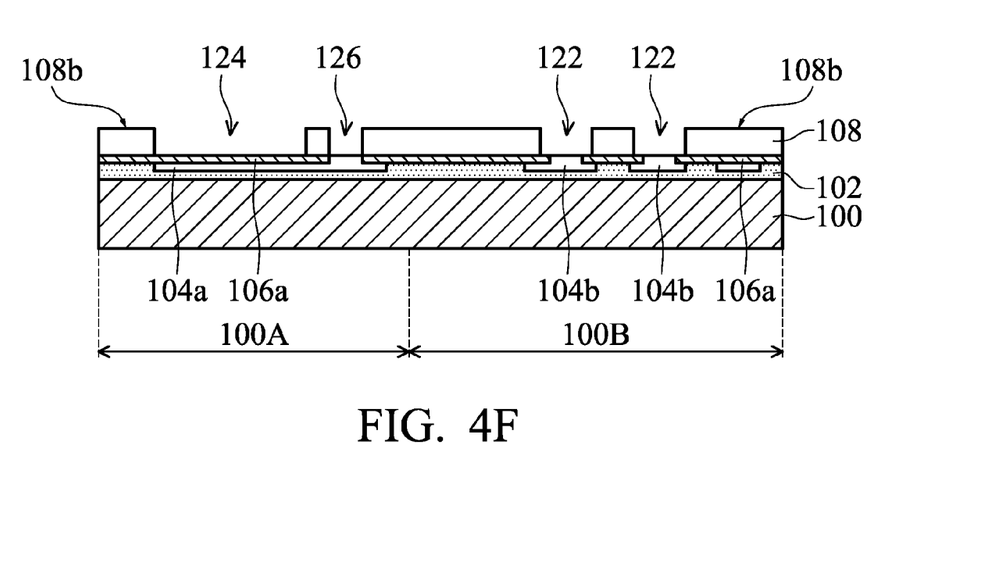

Referring to FIG. 4F, at least one upper-layered opening is formed in the semiconductor substrate 108. For example, openings 124 and 126 corresponding to the capacitor area 100A and openings 122 corresponding to the inductor area 100B are formed on the upper surface 108b of the semiconductor substrate 108 by a photolithography and etching process. The above mentioned openings 122, 124 and 126 are passing through the semiconductor substrate 108, wherein the openings 122 at the inductor area 100B expose the first conductive layer 140b, the opening 124 at the capacitor area 100A exposes the dielectric layer 106a, and the opening 126 at the capacitor area 100A exposes the first conductive layer 140a.

Figure 4G:
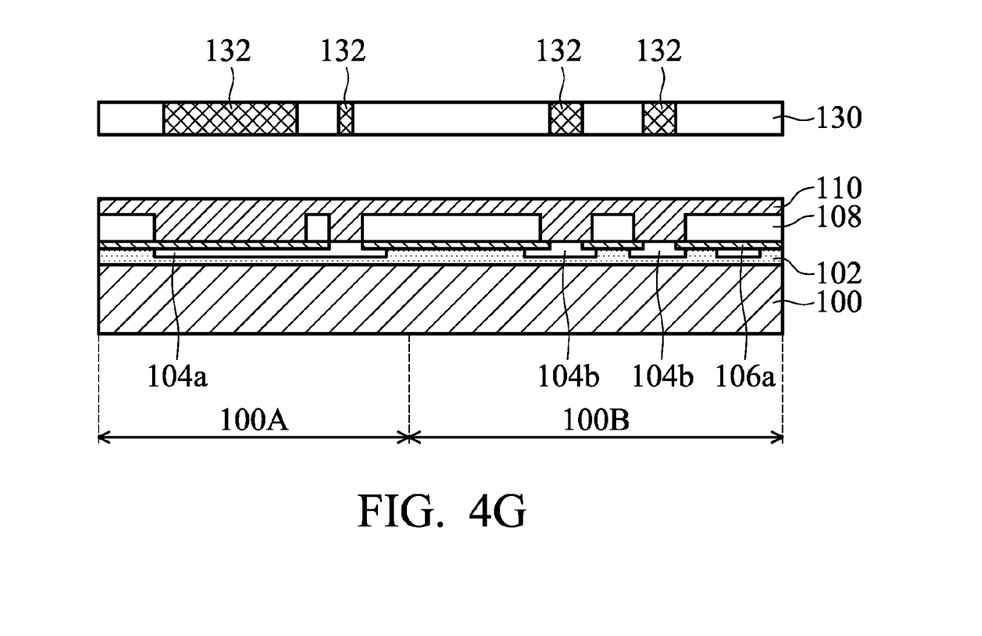
Figure 4H:
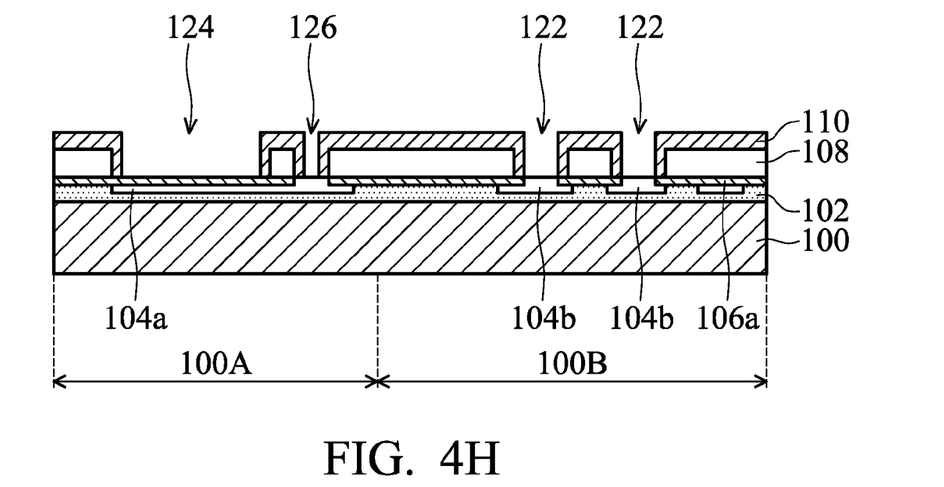

Referring to FIG. 4G, a protective layer is formed to cover the semiconductor substrate 108. For example, a material of a first protective layer 110, such as a photosensitive organic polymer material of polyimide, is coated on the surface of the semiconductor substrate 108 and in the openings 122, 124 and 126 by a coating method. The thickness of the first protective layer 110 may be about 5 µm. Next, a photo mask 130 having a photo mask pattern 132 is provided over the first protective layer 110. After an exposure and development process, parts of the first protective layer 110 corresponding to the photo mask pattern 132, such as the parts in the openings 122, 124 and 126 are removed to form a patterned first protective layer 110, as shown in FIG. 4H. The first protective layer 110 is conformally formed on the surface of the semiconductor substrate 108 and on the side walls of the openings 122, 124 and 126. The parts of the first protective layer 110 on the bottoms of the openings 122, 124 and 126 are removed.

Figure 4I:
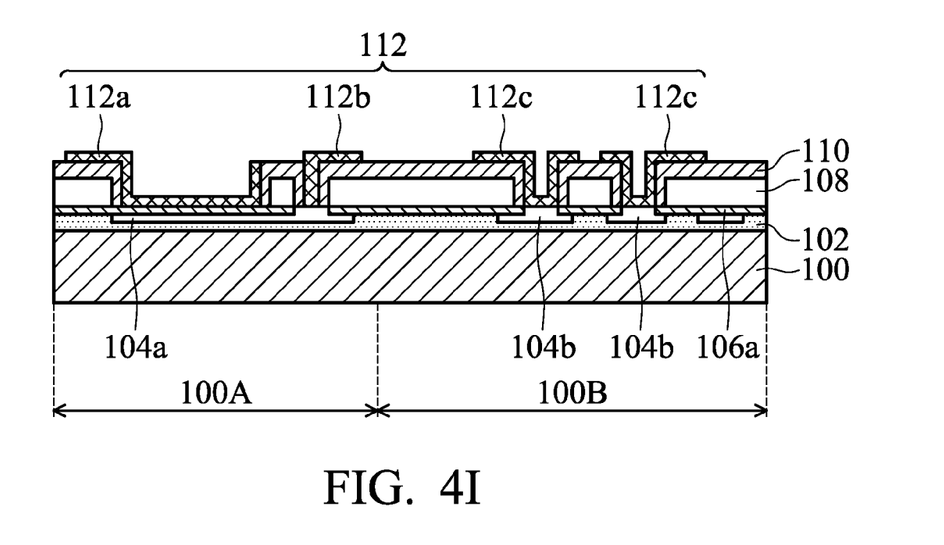

Next, referring to FIG. 4I, a second conductive layer 112 is formed in the openings 124 and 126 and/or the openings 122. For example, a metal layer (not shown) is conformally formed on the surface of the first protective layer 110 and in the openings 122, 124 and 126, covering the side walls and the bottoms of the openings 122 and 124 by an electroplating process or a deposition process. Because the opening 126 is the smallest opening, which can be directly filled with the conductive layer 112b. The opening 126 is disposed corresponding to the conductive layer 104a at the capacitor area which is used for a lower electrode layer of the capacitor. Moreover, the openings 122 are smaller than the opening 124, such that the conductive layer 112c can be conformally formed in the openings 122 corresponding to the inductor area or directly fill up the openings 122. In order to make the capacitor component have a greater sized surface area, the opening 124 can be selected to have a great area. Thus, the conductive layer 112a can be conformally formed in the opening 124 corresponding to the capacitor area and combined with the dielectric layer 106a and the conductive layer 104a to form a sandwich structure. The metal layer may be formed from copper and has a thickness of about 10 µm. Similarly, a seed layer for copper electroplating is firstly formed by a deposition process and then a copper layer is coated on the seed layer by an electroplating process to form the metal layer. Then, the metal layer is patterned by a photolithography and etching process to form a patterned second conductive layer 112.

Figure 4J:
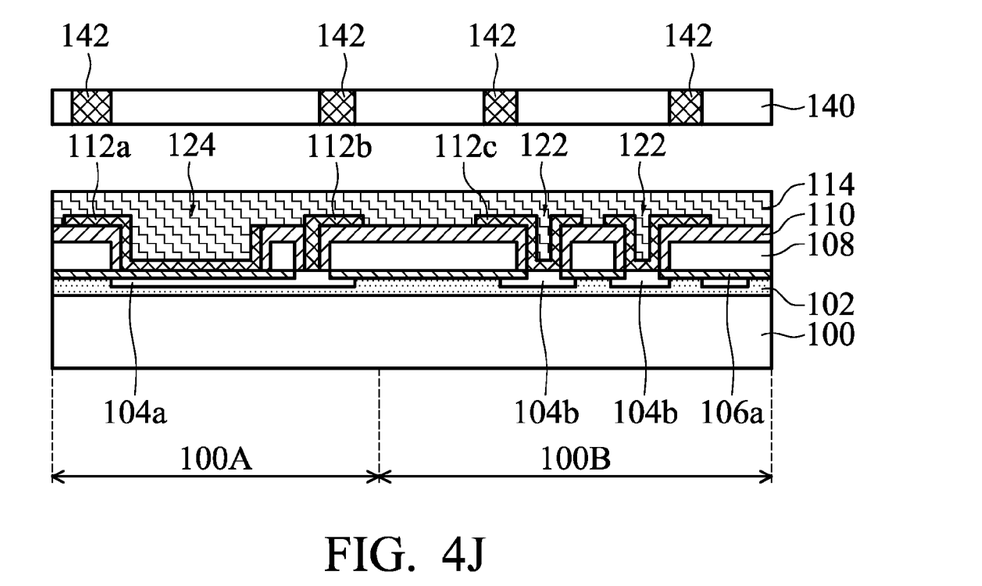
Figure 4K:
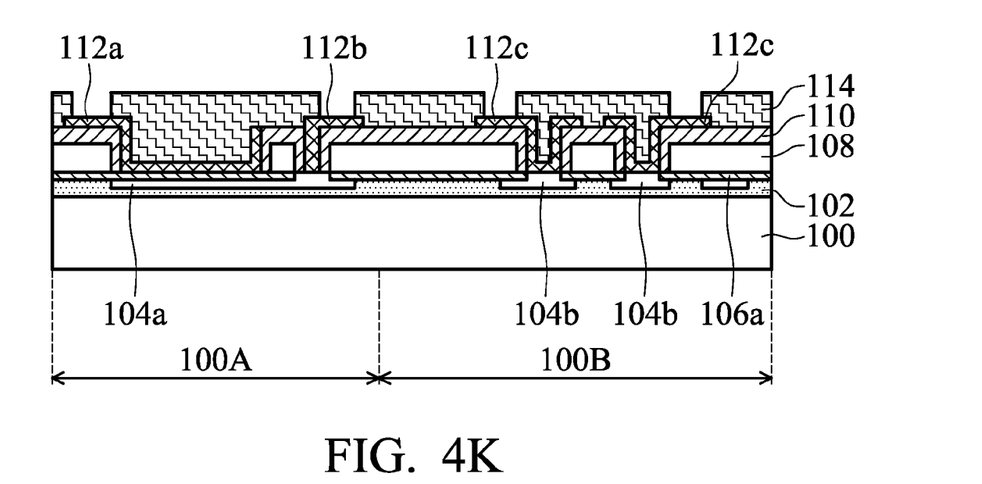

Referring to FIG. 4J, a second protective layer 114 is formed to cover the second conductive layer 112 and the first protective layer 110. For example, a material of the second protective layer 114 such as a photosensitive organic polymer material of polyimide is coated on the second conductive layer 112 and the first protective layer 110 and to fill up the openings 122 and/or the opening 124 by a coating method. The thickness of the second protective layer 114 may be about 15 µm. Next, a photo mask 140 having a photo mask pattern 142 is provided over the second protective layer 114. After an exposure and development process, parts of the second protective layer 114 corresponding to the photo mask pattern 142 are removed to form a patterned planarized second protective layer 114, as shown in FIG. 4K. The patterned planarized second protective layer 114 exposes parts of the second conductive layers 112*a*, 112*b* and/or 112*c* and subsequently forms electrical connection routes to an external circuit for the upper and the lower electrode layers of the capacitor and for the inductor.

Next, the second protective layer 114 is bonded to a temporary carrier (not shown), for example using a UV curable thin film tape to adhere on the second protective layer 114 for bonding with the temporary carrier. Then, the glass substrate 100 is thinned by a thinning process such as a polishing process or an etching process. The thickness of the glass substrate 100 can be reduced from about 400 μm to about 200 μm. Then, the temporary carrier is removed and the wafer is diced to separate each electronic device.

The difference between the electronic devices of FIG. 3 and FIG. 4K is whether the conductive layers 112*c* fill up the openings 122 corresponding to the inductor area.

In an embodiment of the invention, the conductive layer and/or the dielectric layer of the passive component can be formed between the glass substrate and the semiconductor substrate, such that the capacitance density or the quality factor (Q) of the passive component is enhanced. In another embodiment, for example a capacitor-inductor integrated component, the first conductive layer thereof can be used for the lower electrode layers of the capacitor and the inductor simultaneously and disposed on the same plane. The second conductive layer also can be formed in the upper-layered openings to form the upper electrode layers of the capacitor and the inductor and disposed on the same plane. Accordingly, the capacitor and the inductor can be flat through the co-planar design for the above mentioned conductive layers. Moreover, the capacitor and/or the inductor can be formed on the high resistance glass substrate, such that the capacitance density or the quality factor (Q) of the capacitor and the inductor are enhanced. In an embodiment, the capacitance density above about 0.89 $nF/m^2$ can be achieved and the quality factor above about 60 can be achieved. For example, the inductor may be a square-shaped spiral inductor has a structure of two and one half of circles. A spiral area of the inductor is about 0.6 mm*0.5 mm, a width of the electrode layer 104*b* is about 20 μm, and a pitch between the electrode layers from a top view is about 20 μm. Accordingly, the inductance value of the inductor at 2.4 GHz is about 2.3 nH, the quality factor thereof at 2.4 GHz is about 31 and the greatest quality factor thereof at 4 GHz is about 36. In another embodiment, the inductor may be a circle-shaped spiral inductor, having a structure of two and one half of circles. A spiral area of the inductor is about 0.6 mm*0.5 mm, a width of the electrode layer is about 20 μm, and a pitch between the electrode layers from a top view is about 20 μm. Accordingly, the inductance value of the inductor at 2.4 GHz is about 2.2 nH, the quality factor thereof at 2.4 GHz is about 34 and the greatest quality factor thereof at 6 GHz is about 40.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
a glass substrate; a patterned semiconductor substrate, having at least one opening, disposed on the glass substrate; and at least one passive component having a first conductive layer and a second conductive layer, wherein the first conductive layer is disposed between the patterned semiconductor substrate and the glass substrate, and wherein the second conductive layer is disposed in said at least one opening and extends completely across a bottom of said at least one opening of the patterned semiconductor substrate, wherein a dielectric layer having an opening is disposed on the patterned semiconductor substrate, and wherein the first conductive layer extends over at least a portion of the dielectric layer and into the opening of the dielectric layer and contacting the second conducting layer extending across the bottom of said at least one opening of the patterned semiconductor substrate.

2. The electronic device as claimed in claim 1, wherein the passive component is an inductor, and the first conductive layer is electrically connected to the second conductive layer.

3. The electronic device as claimed in claim 1, wherein the passive component is a capacitor, containing a dielectric layer, and wherein the dielectric layer is disposed between the patterned semiconductor substrate and the glass substrate, and the dielectric layer, the first conductive layer and the second conductive layer are combined to form a sandwich structure.

4. The electronic device as claimed in claim 1, wherein at least one passive component comprises a capacitor and an inductor, and the patterned semiconductor substrate contains a first opening corresponding to the capacitor and a second opening corresponding to the inductor, and wherein the second conductive layer is disposed in the first opening and the second opening.

5. The electronic device as claimed in claim 4, wherein the second conductive layer disposed in the second opening corresponding to the inductor is electrically connected to the first conductive layer.

6. The electronic device as claimed in claim 4, wherein the capacitor contains a dielectric layer, and wherein the dielectric layer is disposed between the patterned semiconductor substrate and the glass substrate.

7. The electronic device as claimed in claim 6, wherein the second conductive layer disposed in the first opening corresponding to the capacitor is combined with the first conductive layer and the dielectric layer to form a sandwich structure.

8. The electronic device as claimed in claim 1, further comprising an adhesive layer for bonding the patterned semiconductor substrate and the glass substrate.

9. The electronic device as claimed in claim 1, further comprising a first protective layer for isolating the second conductive layer and the patterned semiconductor substrate.

10. The electronic device as claimed in claim 9, further comprising a second protective layer for covering the second conductive layer and the first protective layer.

11. The electronic device as claimed in claim 10, wherein the materials of the first protective layer and the second protective layer comprise a photosensitive insulating material.

12. The electronic device as claimed in claim 1, wherein the first conductive layer is electrically connected to the portion of the second conductive layer across the bottom of said at least one opening of the patterned semiconductor substrate.

13. The electronic device as claimed in claim 12, wherein the second conductive layer does not extend to a bottom surface of the patterned semiconductor substrate.

14. The electronic device as claimed in claim 1, wherein the second conductive layer is conformally formed within said at least one opening of the patterned semiconductor substrate.

15. A method for fabricating an electronic device, comprising: providing a semiconductor substrate, having a passive component area; forming a dielectric layer on the semiconductor substrate forming a plurality of lower-layered openings in the dielectric layer; forming a first conductive layer on the dielectric layer and in the lower-layered openings; providing a glass substrate for bonding the semiconductor substrate with the glass substrate, wherein the dielectric layer and the first conductive layer are disposed between the glass substrate and the semiconductor substrate; patterning the semiconductor substrate to form a plurality of upper-layered openings at the passive component area of the semiconductor substrate; and forming a second conductive layer in the upper-layered openings of the semiconductor substrate, extending completely across a bottom of said upper-layered openings of the semiconductor substrate, wherein the first conductive layer extends over at least a portion of the dielectric layer and into the lower-layered openings of the dielectric layer and contacting the second conducting layer extending across the bottom of said upper-layered openings of the semiconductor substrate.

16. The method as claimed in claim 15, further comprising:
forming a first protective layer on the patterned semiconductor substrate and on side walls of the upper-layered openings, wherein the plurality of upper-layered openings expose the dielectric layer and/or the first conductive layer in the lower-layered openings, and
wherein the second conductive layer is formed on the first protective layer and in the upper-layered openings for contacting with the dielectric layer and/or the first conductive layer.

17. The method as claimed in claim 16, wherein the passive component is an inductor, and the first conductive layer is electrically connected to the second conductive layer.

18. The method as claimed in claim 16, wherein the passive component is a capacitor, and the dielectric layer, the first conductive layer and the second conductive layer are combined to form a sandwich structure.

19. The method as claimed in claim 16, wherein after the step of bonding the semiconductor substrate with the glass substrate, further comprising thinning the semiconductor substrate.

20. The method as claimed in claim 16, further comprising forming a planarization second protective layer on the second conductive layer and to fill the upper-layered openings.

21. The method as claimed in claim 20, wherein after the step of forming the second protective layer, further comprises thinning the glass substrate.

22. The method as claimed in claim 20, wherein the materials of the first protective layer and the second protective layer comprise a photosensitive insulating material.

* * * * *